United States Patent [19]
Suzuki et al.

[11] Patent Number: 5,585,148
[45] Date of Patent: Dec. 17, 1996

[54] PROCESS FOR FORMING A DEPOSITED FILM USING A LIGHT TRANSMISSIVE PERFORATED DIFFUSION PLATE

[75] Inventors: Nobumasa Suzuki, Yokohama; Senichi Hayashi, Hiratsuka, all of Japan

[73] Assignee: Canon Kabushiki Kaisha, Tokyo, Japan

[21] Appl. No.: 417,908

[22] Filed: Apr. 6, 1995

Related U.S. Application Data

[62] Division of Ser. No. 987,786, Dec. 9, 1992, Pat. No. 5,433,787.

[30] Foreign Application Priority Data

Dec. 12, 1991 [JP] Japan .................... 3-329018

[51] Int. Cl.⁶ .................... B05D 3/06; H05H 1/00
[52] U.S. Cl. .................... 497/572; 427/574; 427/582; 427/583; 427/584; 118/722; 118/723 MP
[58] Field of Search ...................... 427/572, 574, 427/582, 583, 584; 118/722, 723 MP

[56] References Cited

U.S. PATENT DOCUMENTS

| | | | |
|---|---|---|---|
| 4,715,318 | 12/1987 | Kameyawa et al. | 118/722 |
| 4,989,544 | 2/1991 | Yoshikawa | 118/722 |

FOREIGN PATENT DOCUMENTS

| | | | |
|---|---|---|---|
| 60-130126 | 7/1985 | Japan | 427/583 |
| 61-196542 | 8/1986 | Japan | 118/722 |
| 62-206823 | 9/1987 | Japan | 118/722 |
| 2-122077 | 5/1990 | Japan | 118/723 MP |
| 3-268320 | 11/1991 | Japan | 118/722 |

*Primary Examiner*—Roy V. King
*Attorney, Agent, or Firm*—Fitzpatrick, Cella, Harper & Scinto

[57] ABSTRACT

A process for forming a deposited film on a substrate including generating a plasma in a plasma generating chamber via a light transmissive perforated diffusion plate which is located adjacent to a reaction chamber containing the substrate. The plasma thereby excites a gas, which is introduced into the reaction chamber through the light-transmissive perforated diffusion plate. A gaseous starting material for forming the deposited film is introduced into the reaction chamber and reacts with the excited gas. A deposited film is formed on the substrate while irradiating the substrate with a light scattered by the light-transmissive perforated diffusion plate.

7 Claims, 5 Drawing Sheets

PROCESS FOR FORMING A DEPOSITED FILM USING A LIGHT TRANSMISSIVE PERFORATED DIFFUSION PLATE

This application is a division of application Ser. No. 07/987,786 filed Dec. 9, 1992, now U.S. Pat. No. 5,433,787.

BACKGROUND OF THE INVENTION

1. Field of the Invention

The present invention relates to an apparatus and a process for forming a deposited film. In particular, the present invention relates to an apparatus and a process for forming a deposited film which are capable of forming $SiO_2$ or SiN film with high quality and uniformity on a substrate.

2. Related Background Art

Deposited film formation apparatuses play an important role in manufacture of semiconductor devices and electronic circuits, particularly of ultra LSIs. For example, plasma CVD apparatuses are employed to form SiN films for use as a final protective film; plasma CVD apparatuses or atmospheric pressure CVD apparatuses are employed to form $SiO_2$ film for interlayer insulation; and sputtering apparatuses are employed to form thin aluminum films for wirings.

Regarding $SiO_2$ films for interlayer insulation, as the devices are being made finer, three-layer structure has come to be used in which spin-on-glass (SOG), which is excellent in step-covering property, is interposed between $SiO_2$ films for insulation which are formed by plasma CVD or atmospheric pressure CVD. However, this type of interlayer insulation film is liable to cause cracks therein owing to shrinkage after post-heat-treatment of SOG. Therefore the film has to be formed in several steps in order to suppress the occurrence of cracks. As a result, there is a problem of increasing step number. For one-step formation of an $SiO_2$ film having excellent step-covering property, a method of atmospheric pressure CVD is being investigated in which $O_3$ and tetraethyl orthosilicate ($Si(OC_2H_5)_4$, abbreviated to TEO, also called tetraethoxysilane) are used as starting gaseous materials. In the atmospheric pressure CVD, however, the reaction proceeds mainly by surface reaction, so that the reaction is incomplete as a whole. This method may sometimes cause cracks in the film or corrosion of aluminum wiring on the film by contamination with a large amount of radicals of hydroxyl, ethyl, etc., especially at a low temperature below 400° C. required to form interlayer insulation films. In contrast, the plasma CVD enables formation of $SiO_2$ films with better quality than the atmospheric pressure CVD at temperature below 400° C.

In the atmospheric pressure CVD and plasma CVD, Irradiation of light during film formation is known to accelerate the film formation reaction. Since, in principle, the deposited film-forming apparatuses which utilize light enable treatment at a lower temperature with less damage, they are expected to be used and they are now starting to be applied to cleaning and annealing processes.

In the formation of a deposited film by the method utilizing light, a window for introducing the light is provided generally in a reaction vessel. However, the film is formed also on the face of the window, thereby blurring the window and reducing greatly the illuminance of the incident light introduced into the reaction vessel. A method for preventing the blurring of the window such as a grease-coating method, a gas-purging method and the like are reported. FIG. 9 and FIG. 10 are schematical views of structures of the conventional deposited film-forming apparatuses employing respectively a grease-coating method and a gas-purging method to prevent the blurring of the light introduction window.

In the deposited film-forming apparatus as shown in FIG. 9, a transparent light introducing window 61 constitutes the upper face of a cylindrical reaction vessel 50, and an illumination system 60 as the light source is provided in contact with the upper face of the light introducing window 61. An evacuation opening 59 connected to an evacuation pump not shown in the drawing is provided at the bottom of the reaction vessel 50. Above the evacuation opening 59 of the reaction vessel 50, a supporting member 53 is provided for supporting a substrate 52 to be treated. The starting gases for the reaction are fed into the reaction vessel 50 through a ring-shaped starting gas-introducing tube 58. In this apparatus, the starting gas-introducing tube 58 is placed by the side of the substrate 52 to feed the starting gases from the periphery of the substrate 52, so that the light from the illumination system 60 is not intercepted and is illuminated uniformly onto the substrate 52. Onto the inside face of the light introducing window 61 of the reaction chamber, a transparent grease is applied. With this constitution of the deposited film-forming apparatus, film formation and blurring on the light introducing window is prevented since the inorganic thin films conventionally used for semiconductor devices are less liable to adhere onto grease.

The deposited film-forming apparatus as shown in FIG. 10 differs from the one in FIG. 9 in that a perforated separation plate 62 is provided to separate the reaction chamber into an upper space and a lower space of the chamber vessel 50: the upper space being a purge chamber 54 and the lower space being a reaction chamber 51. The substrate 52, the supporting member 53, the starting gas-introducing tube 58, an evacuation opening 59 are placed in the reaction chamber 51. Purge gas introducing tubes 57 are placed in the purge chamber 54. The purge gas does not participate directly in the reaction, but serves to keep the pressure in the purge chamber 54 higher than that of the reaction chamber 51. In the deposited film-forming apparatus shown in FIG. 10, the light-introducing window 61 is not coated with grease. In this deposited film-forming apparatus, diffusion of the starting gases into the gas purge chamber 54 is prevented by maintaining the pressure in the purge chamber 54 higher than that in the reaction chamber 51, thereby the film is formed on the substrate 52 without formation of a film on the light introducing window 61.

In the deposited film-forming apparatuses employing light irradiation as described above, the starting gas is introduced from the periphery of the substrate so that light is irradiated on the substrate uniformly. Therefore the apparatuses have a disadvantage that the pressure and composition of the starting gas are not uniform on the surface of the substrate and the film thickness may vary depending on the pressure of film formation. Further, in the case where grease is applied to prevent the film formation on the light introducing window, the apparatuses have the disadvantage that a grease component evaporated by light irradiation is liable to contaminate the formed film, and if the illuminance of the light is increased to promote the film formation, the grease itself may cause the blurring of the window. In the gas purge method, when the pressure is insufficient to purge the starting gases, a film may deposit on the separation plate to cause blurring and thereby form a non-uniform deposited film even if the separation plate is transparent.

SUMMARY OF THE INVENTION

An object of the present invention is to provide an apparatus and a process for forming a deposited film which solve the problems of the prior art as described above.

Another object of the present invention is to provide an apparatus and a process for forming a deposited film uniformly on a substrate with less blurring of a light introducing window.

A further object of the present invention is to provide an apparatus and a process for forming a deposited film which are capable of forming a thin film having good step-covering property with high quality.

DETAILED DESCRIPTION OF THE PREFERRED EMBODIMENTS

Figure 1:
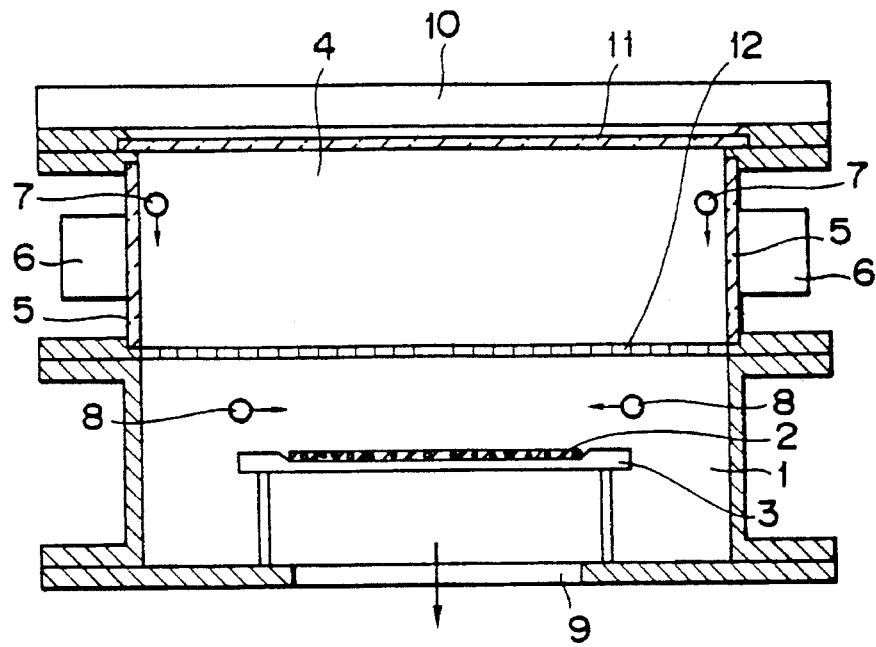
FIG. 1, FIG. 2 and FIG. 3 are schematical views showing examples of a deposited film-forming apparatus of the present invention, respectively.

The preferred embodiments of the deposited film-forming apparatus of the present invention are described below.

A first embodiment of the deposited film-forming apparatus of the present invention comprises a reaction chamber, a supporting member provided in the reaction chamber for holding a substrate, a plasma generating chamber adjacent to the reaction chamber with interposition of a light-transmissive perforated diffusion plate wherein at least a part of the plasma generating chamber is made of a light-transmissive member, a plasma-generation means for generating plasma in the plasma generating chamber, a first gas-introduction means for introducing a gas into the reaction chamber, a second gas-introduction means for introducing another gas into the plasma generating chamber, an evacuation means for evacuating the reaction chamber and the plasma generating chamber, and a light source provided outside the plasma generating chamber for irradiating light to the substrate held on the supporting member through the plasma generating chamber and the perforated diffusion plate, wherein the perforated diffusion plate has a light-scattering diffusion face at least at the side of the reaction chamber.

A second embodiment of the deposited film-forming apparatus of the present invention comprises a reaction chamber, a supporting member provided in the reaction chamber for holding a substrate, a light-transmissive perforated diffusion plate having at least one light-scattering face, a purge chamber adjacent to the reaction chamber with interposition of the light-transmissive perforated diffusion plate wherein at least a part of the purge chamber is made of a light-transmissive member, a first gas-introduction means provided inside the perforated diffusion plate for introducing a depositable gas into the reaction chamber, a second gas-introduction means for introducing non-depositable gas into the purge chamber, an evacuation means for evacuating the reaction chamber and the purge chamber, and a light source provided outside the purge chamber for irradiating light to the substrate held on the supporting member through the purge chamber.

A third embodiment of the deposited film-forming apparatus of the present invention comprises a reaction chamber, a supporting member provided in the reaction chamber for holding a substrate, a light-transmissive perforated diffusion plate having at least one light-scattering face, a plasma generating chamber adjacent to the reaction chamber with interposition of the light-transmissive perforated diffusion plate wherein at least a part of the plasma generating chamber is made of a light-transmissive member, a plasma generation means for generating plasma in the plasma generating chamber, a gas introduction means provided inside the perforated diffusion plate for introducing a gas into the reaction chamber or the plasma generating chamber, an evacuation means for evacuating the reaction chamber and the plasma generating chamber, and a light source provided outside the plasma generating chamber for irradiating light to the substrate held on the supporting member through the plasma generating chamber and the perforated diffusion plate.

A fourth embodiment of the deposited film-forming apparatus of the present invention comprises a reaction chamber, a supporting member provided in the reaction chamber for holding a substrate, a light-transmissive perforated diffusion plate, a plasma generating chamber adjacent to the reaction chamber with interposition of the perforated diffusion plate wherein at least a part of the plasma generating chamber is made of a light-transmissive member, a plasma generating means for generating plasma in the plasma generating chamber, a first gas-introduction means for introducing a depositable gas to the central portion of the substrate in the reaction chamber, a second-gas introduction means provided separated from the first gas Introduction means for introducing the depositable gas to periphery of the substrate in the reaction chamber, a third-gas introduction means for introducing a non-depositable gas into the plasma generating chamber, an evacuation means for evacuating the reaction chamber and the plasma generating chamber, and a light source provided outside the plasma generating chamber for irradiating light to the substrate held on the supporting member through the plasma generating chamber and the perforated diffusion plate.

The preferred embodiment of the process for forming a deposited film of the present invention is a method comprising the steps of generating a plasma in a plasma generating chamber adjacent to a reaction chamber provided with a substrate for forming a deposited film with interposition of the light-transmissive perforated diffusion plate; introducing a gas excited by the plasma through the perforated diffusion plate into the reaction chamber; introducing a gaseous starting substance reactive to the excited gas into the reaction chamber to cause reaction; and forming a deposited film on the substrate placed in the reaction chamber under irradiation to the substrate with light scattered by the perforated diffusion plate.

In the first embodiment of the present invention, a perforated diffusion plate is employed which has a light-scattering diffusion face at least on the side of a reaction chamber. Therefore, illuminance on a substrate is made more uniform by diffusion of incident light by the perforated diffusion plate. The perforated diffusion plate gives a difference of the internal pressure between the plasma generating chamber and the reaction chamber, which prevents nearly completely the diffusion of the depositable gas (the starting gas) from the reaction chamber into the plasma generating chamber, thus preventing the film adhesion on the light introduction window. Even if a film adheres on the perforated diffusion plate and the irregularity of the film cause additional light scattering, the illuminance does not vary significantly on the substrate surface since the incident light has been already scattered by the diffusion face.

The diameter of the through-holes of the perforated diffusion plate should not exceed about 3 mm, since a larger diameter of the through-holes makes the illuminance on the substrate less uniform by forming the shadow of the through-holes on the substrate. The opening area ratio of the through-holes is preferably in the range of from 1% to 5% based on the whole area of the perforated diffusion plate. If the opening area ratio is more than 5%, the pressure difference between the plasma generating chamber and the reaction chamber becomes insufficient, whereby gas diffusion from the reaction chamber becomes significant, making the prevention of attaching the film to the light introduction window less effective, etc. On the other hand, if the opening area ratio is less than 1%, the pressure in the plasma generating chamber rises excessively to retard the plasma generation. The plasma is generated in the plasma generating chamber by a known method, for example, by application of high frequency power or microwave power to the plasma generating chamber. In such a method, the plasma generating chamber preferably is in a cylindrical form and has a side wall constructed of a quartz tube for supplying the energy effectively into the plasma generating chamber.

Figure 4:
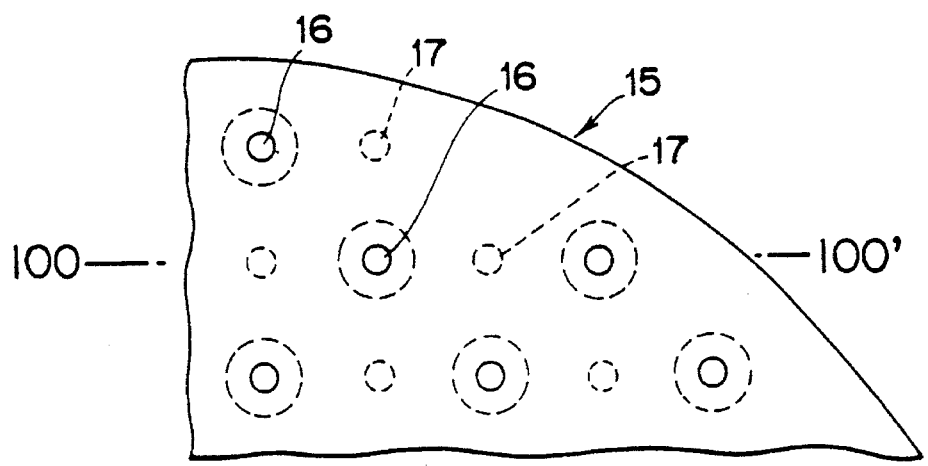
FIG. 4 is a schematical view showing one example of a perforated diffusion plate employed in the deposited film-forming apparatus of the present invention.
Figure 5:
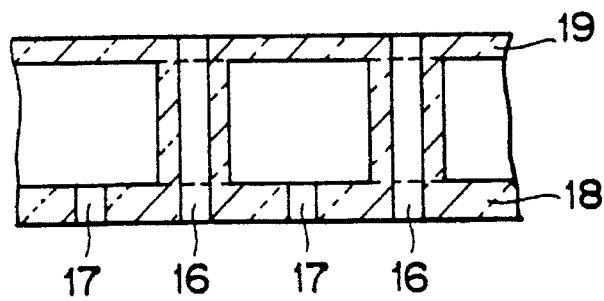
FIG. 5 is a cross-sectional view of the deposited film-forming apparatus as shown in FIG. 4 taken along a line A–A'.

In the second and the third embodiments of the present invention, the apparatus comprises a first gas-introduction means inside a perforated diffusion plate for introducing a depositable gas into the reaction chamber and a second gas-introduction means for introducing a non-depositable gas into a purge chamber or a plasma generating chamber. Thereby both the depositable gas and the non-depositable gas are allowed to flow uniformly from the perforated diffusion plate to the substrate, which enables uniform film formation on the substrate. Such a type of perforated diffusion plate, for example, has a constitution as follows. Two transparent plates are placed at an interval. The plate at the side of the reaction chamber has a large number of holes so as to flow the gas between two plates and supply to the reaction chamber, and tubes are provided which penetrate through the plates at the side of the purge chamber and at the side of the reaction chamber so the two chambers communicate as shown in FIGS. 4 and 5.

The inside diameter of the tubes penetrating the two plates and the diameter of the holes provided on the plate at the side of the reaction chamber are both preferably not larger than 3 mm. The sectional area between the two plates constituting the perforated diffusion plate is preferably sufficiently large in comparison with the area of holes provided on the plate at the side of the reaction chamber in order to feed the depositable gas uniformly.

In the fourth embodiment of the present invention, the apparatus is provided with a first gas-introduction means for feeding a depositable gas above the central portion of the substrate in the reaction chamber, and a second gas-introduction means separated from the first gas-Introduction means for feeding the depositable gas above the periphery of the substrate in the reaction chamber. Thereby, the amount of the depositable gases fed to the periphery portion of the substrate and the central portion are controllable independently. This enables uniform film formation by supplementing the film thickness at the central portion in comparison with the conventional apparatus where the central portion of the film tends to be thin. In this apparatus, the first gas introduction tube is desirably a light-transmissive fine tube having through-holes on the side wall thereof so as not to form shadows on the substrate, and is desirably has a rectangular cross-section so as not to condense the light.

In the first to the fourth embodiments, the depositable gases to be fed directly to the reaction chamber includes organic silane compounds such as $SiH_4$, $Si_2H_6$, $SiCl_2H_2$, alkoxysilane, siloxane, and silanol; organic compounds such as diborane, arsine, phosphine. alkane, alkene, alkyne, alcohol, and benzene; organoaluminum compounds, organotitanium compounds, $WF_6$, organotungsten compounds, organomolybdenum compounds, organotantalum compounds, and so forth. The non-depositable gases to be fed to the purge chamber or a plasma generating chamber includes $O_2$, $O_3$, $N_2O$, $H_2O$, $N_2$, $NH_3$, $N_2H_4$, $H_2$, Ar, and so forth.

With the apparatus of the present invention, $SiO_2$ film can be formed by reacting an oxidizing gas excited by plasma with a silanol having at least one hydroxyl group bonded to the silicon atom. In this process, interaction with the substrate surface is decreased and the surface diffusion is promoted, thus the resulting $SiO_2$ film is improved in the step-covering property. Further, the presence of silanol mainly having a hydroxyl group serves to decrease the contamination with carbon into the film. The irradiation to the substrate with ultraviolet or visible light decreases contamination with hydroxyl, and improves further the quality of the film.

The aforementioned oxidizing gas includes $O_2$, $O_3$, $N_2O$, etc. The silanol may be either an organic silanol containing an alkyl group, etc. or an inorganic silanol containing no alkyl group, etc. but the silanol is preferred which has a higher saturated vapor pressure and has less carbon atoms. The silanol may be formed, just before the reaction of the film deposited on the substrate, by reaction of an organic or inorganic silane with water to increase the feed rate. The plasma for exciting the oxidizing gas may be generated either by high frequency of from about 1 to about 300 MHz or by microwave of from about 0.9 to about 5 GHz. To increase the electron density, a magnetic field may be applied during plasma generation.

The present invention is explained in more detail with reference to the following examples. However, the present invention should not be limited by these examples.

EXAMPLE 1

FIG. 1 illustrates schematically an example of a deposited film-forming apparatus of the present invention. This deposited film-forming apparatus corresponds to the above described first embodiment of the present invention, and comprises a perforated diffusion plate having a light-scattering diffusion face at least at the reaction chamber side of the perforated diffusion plate.

In the deposited film-forming apparatus, the cylindrical reaction chamber 1 has at the bottom thereof an evacuation opening 9 connected through a conductance valve not shown in the drawing to an evacuation pump not shown in the drawing. A supporting member 3 is provided Just above the evacuation opening 9. A substrate 2 to be treated for formation of a film is supported by the supporting member 3. A starting gas introduction tube 8 in a ring shape is provided above the substrate 2 in the reaction chamber 1 so as to introduce a depositable gas therein. The starting gas introduction tube 8 is connected to a starting gas source not shown in the drawing. A perforated diffusion plate 12 partitions the reaction chamber 1 and a plasma-generating chamber 4. The perforated diffusion plate 12 is made of a light-transmissive material such as fused quartz and has many through-holes of not more than 3 mm in diameter at an opening area ratio of from 1 to 5%. The reaction chamber 1 and the plasma-generating chamber 4 are communicated through the perforated diffusion plate 12. The face of the perforated diffusion plate 12 is ground like frosted glass at the side of the reaction chamber 1 to be light-diffusive.

The side wall of the plasma generating chamber 4 is made of a quartz tube 5. Electrodes 6 for generating high-frequency or microwave plasma discharge are attached to the outside of the quartz tube 5. These electrodes 6 are connected to a high-frequency source or a microwave source. Inside the plasma generating chamber 4, a non-depositable gas introduction pipe 7 is provided along the inside wall of the chamber to introduce a non-depositable gas into the plasma generating chamber 4. This non-depositable gas introduction pipe 7 is connected to a non-depositable gas source not shown in the drawing. The upper face of the plasma generating chamber 4 serves as a transparent light-introduction window 11. An illumination system 10 is provided as a light source near and above the light-introduction window 11.

The procedures for forming a deposited film by use of the deposited film forming-apparatus are described below.

A substrate 2 is held on a supporting member 3, and the reaction chamber 1 and the plasma generating chamber 4 are evacuated. Since many through-holes are provided in the perforated diffusion plate 12, not only the reaction chamber 1 but also the plasma-generating chamber is evacuated by evacuation from the evacuation opening at the reaction chamber 1. When a predetermined vacuum degree is achieved, the illumination system 10 is operated. The light from the illumination system 10 is introduced through the light-introduction window 11 and the perforated diffusion plate 12 onto the surface of the substrate 2. Simultaneously, a gas for plasma generation is introduced through the non-depositable gas-introduction tube 7 into the plasma generating chamber 4, and a depositable gas as the starting gas is introduced through the starting gas introduction tube 8. Then high frequency power is applied to the electrodes 6. The pressure is naturally higher in the plasma-generating chamber 4 than in the reaction chamber 1, since evacuation is practiced at the reaction chamber 1.

As the result, plasma discharge occurs in the plasma-generating chamber 4, the non-depositable gas is excited by plasma, and the excited gas moves through the perforated diffusion plate 12 into the reaction chamber. In the reaction chamber 1, the excited gas reacts with the depositable gas to form a film on the substrate 2. The perforated diffusion plate 12, which has a light-diffusive surface at the side of the reaction chamber 1, diffuses the light from the illumination system 10 to give uniform illuminance on the substrate 2, resulting in uniform film formation. The higher pressure in the plasma-generating chamber 4 than in the reaction chamber 1 prevents the diffusion of depositable gas to the plasma-generating chamber 4, thereby preventing adhesion of a film on the light introduction window 11, etc. Although some films adhere on the perforated diffusion plate 12, light scattering caused by the irregularity of the newly adhered film affects little the illuminance on the substrate 2 because the light has already been scattered by the diffusion face of the perforated diffusion plate 12.

When the film has been formed in a predetermined thickness, the application of high frequency or microwave power, and the introduction of the depositable gas and the non-depositable gas are stopped. Then the substrate 2 having the formed film is taken out.

EXAMPLE 2

Figure 2:
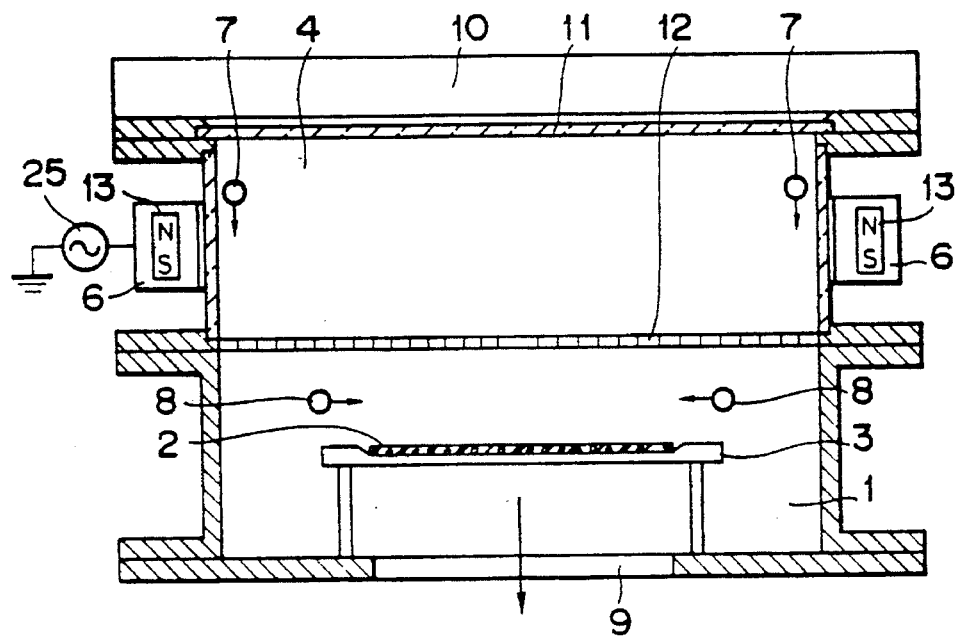

This Example shows formation of an $SiO_2$ film on a substrate 2 with use of high frequency for plasma generation described in Example 1. FIG. 2 illustrates schematically the deposited film-forming apparatus employed in this Example.

This deposited film-forming apparatus comprises magnets 13 within the electrodes 6 with the magnetic pole axis directed vertically, in addition to the apparatus employed In Example 1, in order to apply a magnetic field vertically to the electric field for the plasma generation. The electrodes 6 are connected to a high frequency source 25. As the illumination system 10, an illumination system comprising a xenon lamp and an integrator was used. The perforated diffusion plate 12 made of a fused quartz plate grounded like frosted glass to a roughness of 0.2 mm at the side of the reaction chamber 1, and having through-holes of 2 mm in diameter with the opening area ratio of 2% was used. When a substrate of 150 mm in diameter was used, variation of illuminance on the substrate 2 was ±2%, which was better than the variation of ±5% in conventional light-transmissive perforated plates having no diffusion face.

A film was formed by supplying $O_2$ as a non-depositable gas at a rate of 2 slm (1 slm=1000 sccm) into the plasma generating chamber 4, supplying tetraethyl orthosilicate as a depositable gas at a rate of 200 sccm into the reaction chamber 1, and generating plasma with application of high frequency power of 1 kW to the electrodes 6. After one hundred times of repetition of film formation each for 2 minutes, the light transmittance of the light introduction window was measured, and found that the transmittance changed little from the value before the start of the film formation. The vertical transmittance at the point at a distance of 50 mm from the center of the perforated diffusion plate 12 was 61%, therefore the change of the transmittance was little-in comparison with the value of 64% before the film formation.

On the contrary, in the case where the conventional transparent perforated plate was used in place of the aforementioned perforated diffusion plate 12, the transmittance changed from 89% (before the formation) to 63% (after the film formation), and the illuminance on the substrate changed greatly. Accordingly, it is clear that, with the transparent perforated plate of this example, absolute illuminance is low, but the uniformity of the illuminance is improved and the change of the illuminance during the film formation is little in comparison with the case where the conventional transparent perforated plate is used. Therefore, the transparent perforated plate of this example is practically satisfactory.

EXAMPLE 3

Figure 3:
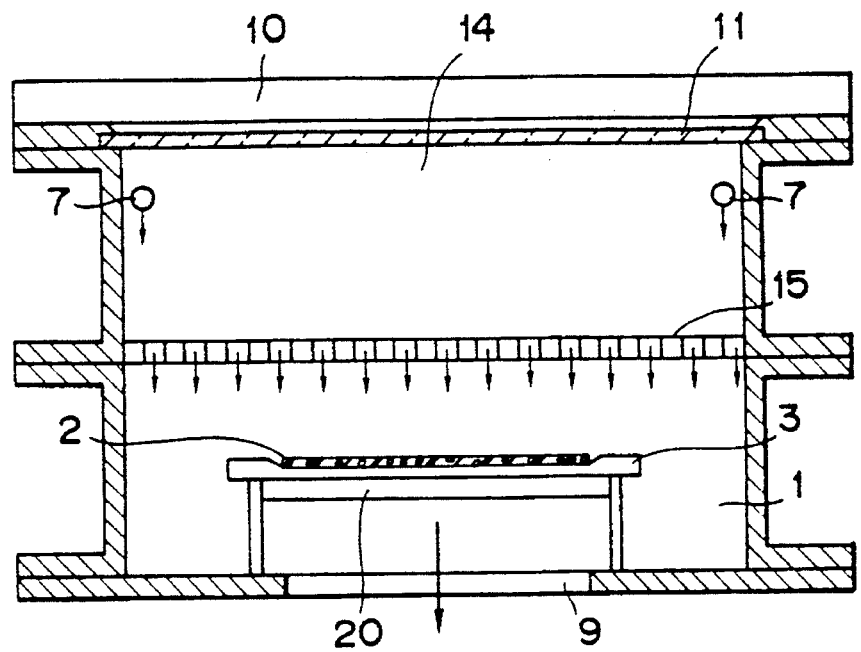

This example corresponds to the second embodiment of the present invention. FIG. 3 illustrates schematically the constitution of a deposited film-forming apparatus employed in this example. FIG. 4 illustrates schematically the perforated diffusion plate employed in the apparatus shown in FIG. 3. FIG. 5 is a sectional view taken along the line 100–100' in FIG. 4.

The deposited film-forming apparatus in this example is similar to the one in Example 1 except that the depositable gas is introduced through the inner part of the perforated diffusion plate 15 into the reaction chamber 1 and the plasma discharge is not employed. Therefore, a starting gas introduction tube is not provided in the reaction chamber, but a cylindrical purge chamber 14 is provided in place of the plasma generating chamber. The purge chamber 14 has a bottom made of a perforated diffusion plate 15 and has the upper face made of a light introduction window 11 as similarly to the plasma generating chamber 4 (FIG. 1) of Example 1. A non-depositable gas, such as a purge gas, is introduced from the non-depositable gas introduction tube 7 into the purge chamber 14. A heater 20 is provided on the supporting member 3 in the reaction chamber 1 to heat a substrate 2.

The perforated diffusion plate 15 used in this example comprises two light-transmissive plates 18 and 19 placed at an interval as shown in FIG. 4 and FIG. 5. The light-transmissive plate 18 at the lower position, i.e., at the side of the reaction chamber 1, has a large number of ejection holes 17. A depositable gas flows between the two light-transmissive plates 18 and 19 and is fed to the reaction chamber through the ejection holes 17. Tubular through-holes 16 are provided which connect the upper light-transmissive plate 19 with the lower light-transmissive plate 18. The through-holes 16 are constructed in a tubular form such that the non-depositable gas does not enter the space between the two transparent plates 18 and 19. The through-holes 16 and the ejection holes 17 both have an inside diameter of not larger than 3 mm. The space between the light-transmissive plates 18 and 19 is connected to a depositable gas source not shown in the drawing. The lower light-transmissive plate 18 is grounded like frosted glass as in Example 1.

By use of this deposited film-forming apparatus, an SiN film was formed as a protective film by use of silicon plate as the substrate 2 according to a photo-assisted CVD method. A substrate 2 was placed on the supporting member 3. The reaction chamber 1 and the purge chamber 14 were evacuated to a predetermined vacuum degree. The substrate 2 was heated with a heater 20 to a desired temperature between room temperature and several hundred °C. Then $NH_3$ gas was introduced through the non-depositable gas introduction tube 7 into the purge chamber 14, and $SiH_4$ gas was introduced through the ejection holes 17 of the perforated diffusion plate 15 into the reaction chamber 1. The pressure in the reaction chamber 1 was maintained at a desired pressure of from 1 to 20 Torr by controlling a conductance valve (not shown in the drawing) connected to the evacuation opening 9. The light from the illumination system was introduced through the light introduction window 11 and the perforated diffusion plate 15 onto the substrate 12.

As a result, $NH_3$ gas was allowed to flow through the through-holes 16 and $SiH_4$ gas flowed through the ejection holes uniformly toward the substrate 2. The film formation was conducted to obtain a desired film thickness. Consequently a SiN film was formed uniformly with high quality on the substrate 2.

By changing the kind of the gas to be fed to the reaction chamber 1 and the purge chamber 14, films of insulating materials such as SiN, $SiO_2$, $Ta_2O_5$, $Al_2O_3$, AlN, etc.; semiconductor materials such as amorphous Si, polycrystalline Si, GaAs, etc.; metals such as Al, W, etc. can be formed.

EXAMPLE 4

Figure 6:
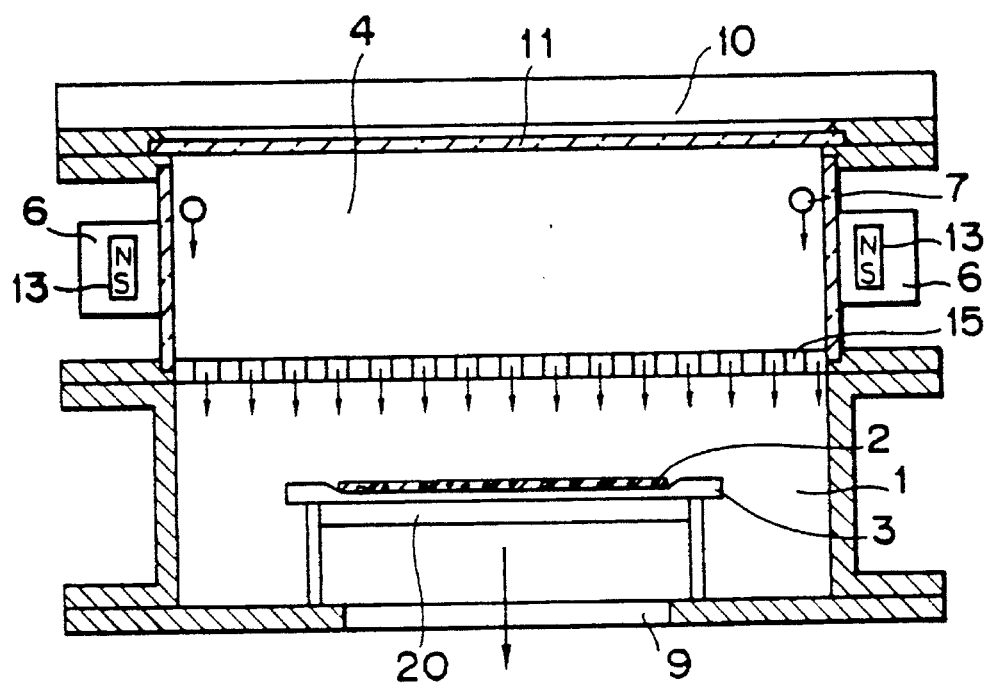
FIG. 6 and FIG. 7 are schematical views showing examples of a deposited film-forming apparatus of the present invention, respectively.

This example corresponds to the third embodiment of the present invention. FIG. 6 illustrates schematically the constitution of a deposited film-forming apparatus employed in this example.

The deposited film-forming apparatus in this example is similar to the one in Example 1 except that the depositable gas is introduced through the inner part of the perforated diffusion plate 15 into the reaction chamber 1. Therefore, a gas introduction tube is not provided in the reaction chamber. The perforated diffusion plate 15 is the same as that employed in Example 3. Magnets 13 are provided within the electrodes 6 with the magnetic pole axis directed vertically In order to apply a magnetic field vertically to the electric field for the plasma generation. The electrodes 6 are connected to a high frequency source. The supporting member 3 in the reaction chamber 1 is provided with a heater 20 thereon to heat the substrate 2.

By use of this deposited film-forming apparatus, an $SiO_2$ film was formed for interlayer insulation on a silicon plate as the substrate 2 by a photo-assisted plasma CVD method. The substrate 2 was held on the supporting member 3. The substrate 2 was irradiated with the light from the illumination system 10 through the light Introduction window 11 and the perforated diffusion plate 15. The reaction chamber 1 and the plasma generating chamber 4 were evacuated to a predetermined vacuum degree. The substrate 2 was heated by the heater 20 to a desired temperature between room temperature and several hundred °C. Then $O_2$ gas was introduced through the non-depositable gas introduction tube 7 into the plasma generating chamber 4, and tetraethyl orthosilicate was introduced through the ejection holes 17 of the perforated diffusion plate 15 into the reaction chamber 1. The pressure in the reaction chamber 1 was maintained at a desired pressure of from 0.1 to 0.5 Torr by controlling a conductance valve (not shown in the drawing) connected to the evacuation opening 9. A high frequency power was supplied to the electrode 6.

As the result, the magnets 13 in the electrodes 6 localized the generation of plasma to the vicinity of the electrodes 6 in the plasma generating chamber 4. The $O_2$ gas was excited by the plasma, and the excited $O_2$ gas and the tetraethyl orthosilicate flowed uniformly respectively through the through-holes 16 and the ejection holes 17 toward the substrate 2. The film formation was conducted to obtain a desired film thickness. Consequently a $SiO_2$ film was formed uniformly with high quality on the substrate 2.

By changing the kinds of the gases to be fed to the reaction chamber 1 and the plasma generating chamber 4, films of insulating materials such as SiN, $SiO_2$, $Ta_2O_5$, $Al_2O_3$, AlN, etc.; semiconductor materials such as amorphous Si, polycrystalline Si, GaAs, etc.; metals such as Al, W, etc. can be formed.

EXAMPLE 5

Figure 7:
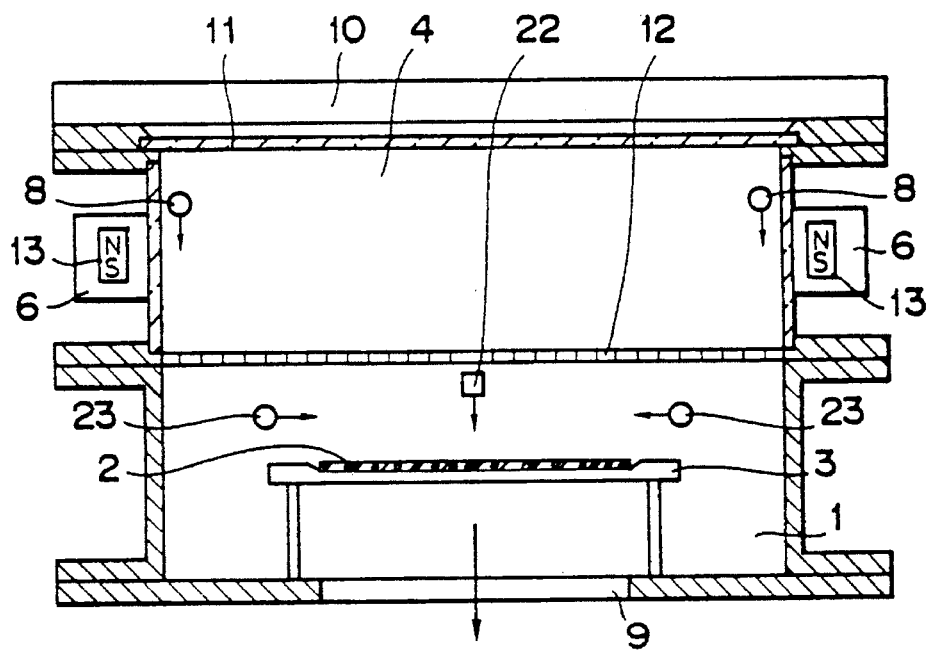
Figure 8:
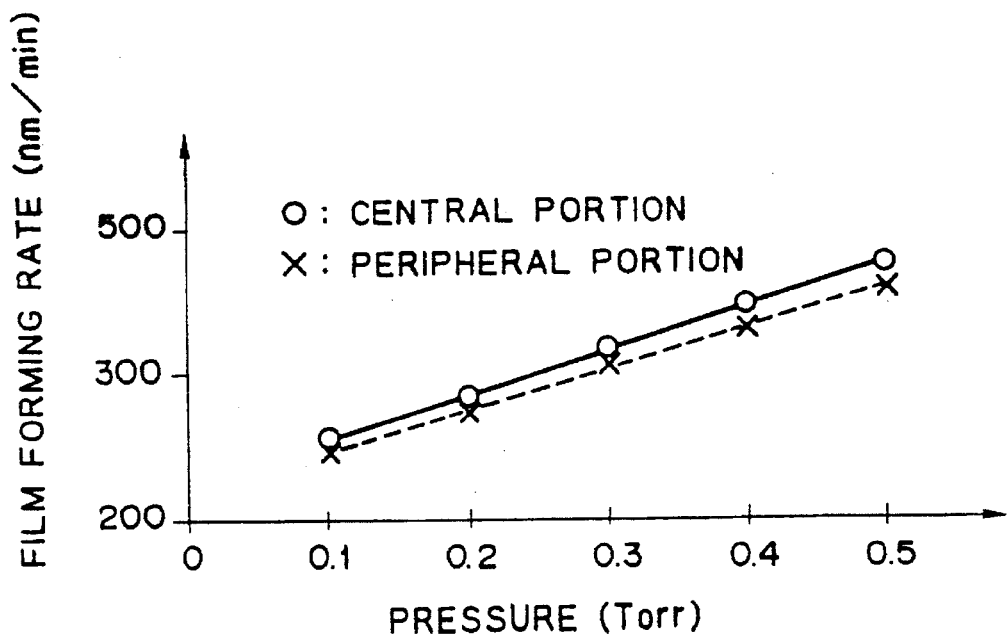
FIG. 8 is a graph showing the dependency of a deposited film formation rate on the pressure in the reaction chamber.
Figure 9:
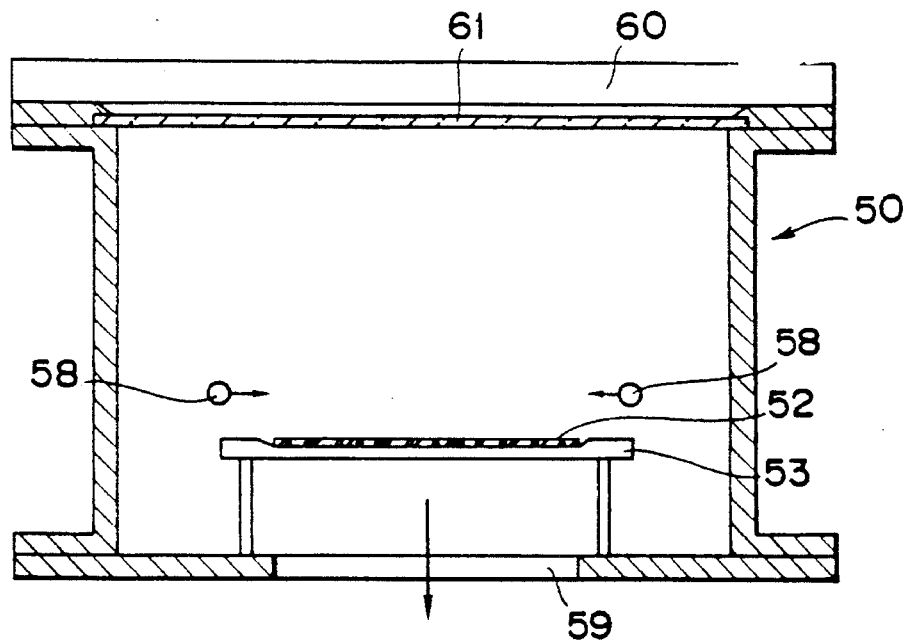
FIG. 9 and FIG. 10 are schematical views showing example of deposited film-forming apparatus of prior art, respectively.
Figure 10:
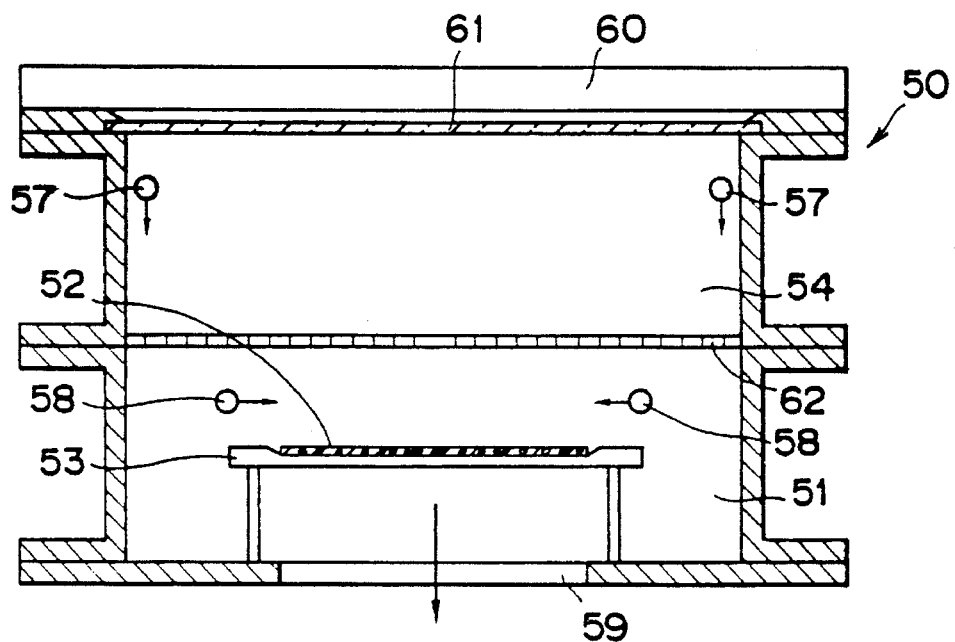

This example corresponds to the fourth embodiment of the present invention. FIG. 7 illustrates schematically the constitution of a deposited film-forming apparatus employed in this example. FIG. 8 shows the dependency of the film deposited rates at the central portion and the peripheral portion of the substrate 2 on the pressure in the reaction chamber 1.

The deposited film-forming apparatus in this example is similar to the one in Example 1 except for the construction of the starting gas introduction tubes.

A first gas introduction tube 22 made of a transparent small tube is provided at the position directly above the substrate 2 in the reaction chamber. This first gas introduction tube 22 has a rectangular cross-section, and has a large number of ejection holes on the face opposite to the substrate 2. A second gas introduction tube 23 in a ring shape is provided above the substrate 2. The first gas introduction tube 22 and the second gas introduction tube 23 feed the same starting gas into the reaction chamber 1, the feeding rates being controllable independently. A third gas introduction tube 8, which feeds a gas different from the gas fed by the first and the second gas introduction tubes 22 and 23, is provided in the plasma generating chamber 4.

This deposited film-forming apparatus is provided with magnets 13 within the electrode 6 with the pole axis directed vertically in order to apply a magnetic field vertically to the electric field for the plasma generation. The electrodes 6 are connected to a high frequency source not shown in the drawing. The supporting member 3 in the reaction chamber 1 has a heater 20 thereon to heat the substrate 2. In the perforated diffusion plate 12, the diameter and the opening area ratio of the through-holes are not limited to those defined in Example 1.

By use of this deposited film-forming apparatus, an $SiO_2$ film was practically formed for interlayer insulation on a silicon plate as the substrate 2 by a photo-assisted plasma CVD method. The substrate 2 was held on the supporting member 3. The substrate 2 was irradiated with the light from the illumination system 10 through the light introduction window 11 and the perforated diffusion plate 15. The reaction chamber 1 and the plasma generating chamber 4 were evacuated to a predetermined vacuum degree. The substrate 2 was heated by the heater 20 to a desired temperature between room temperature and several hundred ° C. Then $O_2$ gas was introduced through the non-depositable gas introduction tube 8 into the plasma generating chamber 4, and tetraethyl orthosilicate was introduced through the first gas introduction tube 22 and the second gas introduction tube 23 into the reaction chamber 1. The pressure in the reaction chamber 1 was maintained at a desired pressure of from 0.1 to 0.5 Torr by controlling a conductance valve (not shown in the drawing) connected to the evacuation opening 9. The gas flow rates in the first gas introduction tube 22 and the second gas introduction tube 23 were controlled independently to supply the traethyl orthosilicate gas uniformly on the substrate 2. A high frequency power was supplied to the electrode 6.

The magnets 13 in the electrodes 6 localized the generation of plasma to the vicinity of the electrodes 6 in the plasma generating chamber 4. The $O_2$ gas was excited by the plasma, and the excited $O_2$ gas was supplied uniformly through the perforated diffusion plate 12 into the reaction chamber 1. In the reaction chamber 1, the excited $O_2$ gas reacted with the tetraethyl orthosilicate under light irradiation from the illumination system 10 to form an $SiO_2$ film on the substrate 2. The film formation was conducted to obtain a desired film thickness. Since the light irradiation and the supply of the tetraethyl orthosilicate gas on the substrate 2 were uniform, a $SiO_2$ film was uniformly formed with high quality on the substrate 2.

As a result of examining the relationship between the film forming rates at the central portion and the peripheral portion of the substrate 2 and the pressure in the reaction chamber 1, the relationship was shown in FIG. 8. The film forming rates at the central portion was nearly equal to the peripheral portion, although the rates increased with the increase of the pressure as a whole.

By changing the kind of the gas to be fed to the reaction chamber 1 and the plasma generating chamber 14, films of materials such as SiN, $SiO_2$, $Ta_2O_5$, $Al_2O_3$, AlN, etc.; semiconductor materials such as amorphous Si, polycrystalline Si, GaAs, etc.; metals such as Al, W, etc. can be formed.

EXAMPLE 6

An $SiO_2$ film for interlayer insulation was formed by a photo-assisted CVD method by use of a deposited film forming apparatus similarly to Example 2. The deposited film forming apparatus which was the same as that employed in Example 2 (FIG. 2) except that a perforated diffusion plate had light-diffusible at least one face was used.

The procedures of the film formation are as follows. A substrate 2 is held on the supporting member 3. The reaction chamber 1 and the plasma generating chamber 4 are evacuated. The substrate is heated to a predetermined temperature between room temperature and several hundred °C. by a heating means not shown in the drawing. Then the substrate 2 is irradiated with light from the illumination system 10 having a xenon lamp as the light source through the light introduction window 11 and the perforated diffusion plate 12. An oxidizing gas is supplied through the non-depositable gas introduction tube 7 to the plasma generating chamber 4, and a silanol which has at least one hydroxyl group bonded directly to the silicon atom is supplied through the starting gas introduction tube 8, while the inside pressure of the reaction chamber 1 is maintained at a desired level of from 0.05 to 1.0 Torr. Further, plasma is generated in the vicinity of the electrodes 6 in the plasma generating chamber 4 by application of a high frequency power of from about 100 to 1000 W under application of magnetic field of several hundred G generated by the magnets 13 to excite the oxidizing gas. Consequently, the excited oxidizing gas moves into the reaction chamber 1, and reacts with the silanol to form an $SiO_2$ film on the substrate 2. When the desired thickness of film has been achieved, the substrate 2 having the formed film is taken out.

The practical formation of the film were conducted as below. $O_2$ gas as the oxidizing gas was supplied to the plasma generating chamber 4 at a rate of 1.5 slm, and silanol Just formed by reaction of silane with water was supplied to the reaction chamber 1 at a rate of 400 sccm. The inside pressure of the reaction chamber 1 was 0.1 Torr, the temperature of the substrate 2 was 300° C., the high frequency power applied to the electrodes 6 was 400 W, and the magnetic flux density generated by the magnets 13 was 150 G. As the result, a $SiO_2$ film having excellent coverage was formed on the substrate with less contamination of hydroxyl group, etc., particularly carbon.

As described above, the deposited film forming apparatus of the present invention has the effects of forming a film uniformly with high quality on a substrate since the illuminance of the light illuminating the substrate and the flow rate and the amount of the gas supplied to the substrate are made uniform by use of: (1) a perforated diffusion plate which is light-transmissive and has a light-scattering diffusion face at least at the reaction chamber side; (2) a first gas introduction means for introducing a depositable gas into a reaction chamber provided inside the perforated diffusion plate, and a second gas introduction means for introducing a non-depositable gas into a purge chamber or a plasma generating chamber; or (3) a first gas introduction means for introducing a depositable gas above the central portion of a substrate, and a second gas introduction means, which provided separately from the first gas introduction means, for Introducing the depositable gas above the periphery of the substrate in the reaction chamber.

Further the deposited film-forming apparatus of the present invention is capable advantageously of forming a $SiO_2$ film, which is of high quality and improved in step coverage properties, by depositing an $SiO_2$ film on a substrate by reaction of an oxidizing gas excited by plasma with a silanol having at least one hydroxyl group bonded directly to a silicon atom, thereby decreasing the interaction with the substrate surface and increasing the surface diffusion.

What is claimed is:

1. A process for forming a deposited film which comprises the steps of:

generating a plasma in a plasma generating chamber provided via a light-transmissive perforated diffusion plate adjacent to a reaction chamber having a substrate arranged therein on which the deposited film is to be formed, thereby exciting a gas;

introducing the gas excited in the plasma generating chamber through the light-transmissive perforated diffusion plate into the reaction chamber;

introducing a gaseous starting material for forming the deposited film into the reaction chamber so that the excited gas reacts with the gaseous starting material; and forming the deposited film on the substrate arranged in the reaction chamber while irradiating the substrate with a light scattered by the light-transmissive perforated diffusion plate.

2. The process according to claim 1, wherein the gas to be excited by the plasma is an oxidizing gas and the gaseous starting material is a silanol having at least one hydroxyl group bonded to a silicon atom and the film deposited on the substrate is a $SiO_2$ film.

3. The process according to claim 1, wherein the light with which the substrate is irradiated is ultraviolet light or visible light.

4. The process according to claim 2, wherein the gas is at least one gas selected from the group consisting of $O_2$, $O_3$ and $N_2O$.

5. The process for forming a deposited film according to claim 2, wherein the process comprises a step of forming the silanol to be used in the reaction step by reaction of an organic silane with water prior to the reaction step.

6. The process for forming a deposited film according to claim 2, wherein the process comprises a step of forming the silanol to be used in the reaction step by reaction of an inorganic silane with water prior to the reaction step.

7. The process according to claim 2, wherein the substrate is irradiated with a ultraviolet light or visible light.

* * * * *

UNITED STATES PATENT AND TRADEMARK OFFICE
CERTIFICATE OF CORRECTION

PATENT NO. : 5,585,148
DATED : December 17, 1996
INVENTOR(S) : NOBUMASA SUZUKI ET AL.

It is certified that error appears in the above-indentified patent and that said Letters Patent is hereby corrected as shown below:

ON TITLE PAGE

[56] U.S. PATENT DOCUMENTS

"Kameyawa et al." should read --Kameyama et al.--.

COLUMN 1

Line 51, "Irradiation" should read --irradiation--.

COLUMN 4

Line 36, "Introduction" should read --introduction--.

COLUMN 5

Line 61, "gas-Introduction" should read --gas-introduction--.

COLUMN 6

Line 8, "includes" should read --include--;
Line 10, "alkoxysllane," should read --alkoxysilane,--;

UNITED STATES PATENT AND TRADEMARK OFFICE
CERTIFICATE OF CORRECTION

PATENT NO. : 5,585,148

DATED : December 17, 1996

INVENTOR(S) : NOBUMASA SUZUKI ET AL.

Page 2 of 3

It is certified that error appears in the above-indentified patent and that said Letters Patent is hereby corrected as shown below:

COLUMN 6 continued

Line 16, "includes" should read --include--;
    Line 61, "Just" should read --just--.

COLUMN 8

Line 40, "little-in" should read --little in--.

COLUMN 9

Line 31, "grounded" should read --ground--.

COLUMN 10

Line 11, "In" should read --in--;
    Line 21, "Introduction" should read --introduction--.

COLUMN 11

Line 42, "traethyl" should read --tetraethyl--.

UNITED STATES PATENT AND TRADEMARK OFFICE
CERTIFICATE OF CORRECTION

PATENT NO. : 5,585,148
DATED : December 17, 1996
INVENTOR(S) : NOBUMASA SUZUKI ET AL.

It is certified that error appears in the above-indentified patent and that said Letters Patent is hereby corrected as shown below:

COLUMN 12

Line 13, Change "had" to --which was-- and add --at-- after "at";
Line 43, "Just" should read --just--;
Line 67, "Introducing" should read --introducing--.

COLUMN 14

Line 24, "a" should read --an--.

Signed and Sealed this

Tenth Day of June, 1997

Attest:

BRUCE LEHMAN

Attesting Officer

Commissioner of Patents and Trademarks